(12) United States Patent  
Matsumoto

(10) Patent No.: US 6,688,896 B2  
(45) Date of Patent: Feb. 10, 2004

(54) ELECTROMAGNETIC WAVE SHIELDING STRUCTURE

(75) Inventor: Mitsuhiro Matsumoto, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/150,938

(22) Filed: May 21, 2002

(65) Prior Publication Data

US 2002/0173181 A1 Nov. 21, 2002

(30) Foreign Application Priority Data

May 21, 2001 (JP) .................................... P2001-150405

(51) Int. Cl.[7] ............................................. H01R 13/648
(52) U.S. Cl. ................................................... 439/98
(58) Field of Search ................................. 439/98, 578

(56) References Cited

U.S. PATENT DOCUMENTS 6,152,745 A * 11/2000 Matsumoto et al. .......... 439/98

FOREIGN PATENT DOCUMENTS

JP        2000-294344        10/2000

* cited by examiner

*Primary Examiner*—Gary Paumen  
(74) *Attorney, Agent, or Firm*—Sughrue Mion, PLLC

(57) ABSTRACT

An electromagnetic wave shielding structure comprising: a cylindrical conductive shielding member secured to a shield cable, which includes a conductor and a braid surrounding the conductor, and electrically connected to the braid, the shielding member being rotatably attached to a mount hole of a grounded conductive mount element in a state in which the shielding member is secured to the shield cable; a metal terminal connected to the conductor of the shield cable; and a housing for housing apart of the shield cable and securing the shielding member to the mount element.

17 Claims, 4 Drawing Sheets

ELECTROMAGNETIC WAVE SHIELDING STRUCTURE

BACKGROUND OF THE INVENTION

The present invention relates to an input/output terminal of a motor to be mounted on an electric-powered vehicle or an electromagnetic wave shielding structure by means of which an electric wire/cable is connected to an input/output terminal of general electronic equipment.

Usually, when an electric wire/cable is connected to an input/output terminal of an electric-powered vehicle, leakage of an electromagnetic wave from the electric wire/cable to the outside is prevented. Conversely, in order to protect the motor from the influence of an external electromagnetic wave, a motor case is grounded, thereby attempting to realize shield conduction.

FIGS. 3 and 4 show the structure of a shielded connector described in Japanese Patent Application Laid-Open No. 294344/2000 filed by the present inventor, as a typical example of a related-art shielding structure for shielding against an electromagnetic wave. In this case, an electric wire/cable to be connected to an input/output terminal of a motor is a shielded cable 1. The shielded cable 1 is formed by means of forming an insulator 3 so as to cover a conductor 2 through extrusion molding; wrapping around an insulator 3 a metal braid 4 serving as a conductive shielding sheet; and coating the insulator 3 with an outer sheath 5 through extrusion such that the braid 4 is sandwiched between the insulator 4 and the outer sheath 5 and embedded in the outer sheath 5.

The sheath 5 is peeled from a terminal portion of the shielded cable 1, thereby exposing the braid 4 and the insulator 3 located beneath it. Further, the insulator 3 is peeled, thereby exposing the conductor 2. Metal terminal 6 is connected to the thus-exposed terminal 2 by means of crimping. The exposed braid 4 is connected to a shielding terminal (shielding member) 7 which constitutes the shielded connector and is made of conductive metal. The shielding terminal 7 is fitted into and connected to a mount hole "b" of a mount element B, such as a motor case. The mount element B is grounded by a ground G, thereby effecting shield conduction of the shielded cable in the sequence of the braid 4->the shielding terminal 7->the mount element B->the ground G.

FIG. 4 is a perspective view showing, as a single element, the shielding terminal 7, which is the primary member of the shielded connector structure. The shielding terminal 7 is a cylindrical element in which a step of different diameter is formed by means of drawing. The shielding terminal 7 is fixed to the outer periphery of the terminal portion of the shielded cable 1 by means of fitting and crimping. As illustrated, the shielding terminal 7 has a flange 7a provided at the upper end of the cylindrical element. A portion of the flange 7a is cut and raised, thereby forming a projection 7b. As shown in FIG. 3, the braid 4 is folded back and brought into contact, from the outside, with a lower portion of the cylindrical element of the shielding terminal 7 press-fitted around the outer periphery of the cable. A braid hold tube 8 covers the folded-back section of the braid 4 from the outside, thus fixing the folded-back section. Thus, the braid 4 is connected to the shielding terminal 7 in such a manner as to enable shield conduction.

As shown in FIG. 3, the shielded connector structure is provided with a housing 9 as one of the other primary components constituting the shielded connector structure, wherein the housing 9 is cylindrically formed from an insulating material or a conductive material such as aluminum. An engagement recess 9a is formed in the housing 9. The projection 7b formed in the shielding terminal 7 is engaged with the engagement recess 9a, whereby the shielding terminal 7 is positioned so as to remain stationary when the cable is rotated about an axis C—C thereof. The flange 7a of the shielding terminal 7 that has been positioned so as to face such a specific direction is sandwiched between a flange section 9b provided on the housing 9 and the mount element B and secured by means of tightening a bolt into a bolt hole 7c formed in the flange 7a. As a result, the shielding terminal 7 is connected to the mount element B, thereby attempting to effect conduction.

As has been described above, in such a shielded connector structure, the shielding terminal 7 fitted around the outer periphery of the terminal portion of the shielded cable 1 is positioned on the housing 9 by means of the projection 7b. The shielding terminal 7 is connected to the mount element B in conjunction with the housing 9 by means of tightening a bolt. As a result, limitations are imposed on movement of the shielded cable 1 such that the cable 1 remains stationary when rotated about the axis C—C thereof. Concurrently, the shielded cable 1 is limited so as not become axially dislodged. In this way, the shielded connector structure is set in the mount hole "b" of the mount element B.

The shielded connector structure shown in FIGS. 3 and 4 is susceptible to improvement in terms of the following points.

One point relates to a problem stemming from the shielding terminal 7 press-fitted to the outer periphery of the terminal portion of the shielded cable 1 being positioned stationary so as not to move along the axis C—C thereof, by means of causing the projection 7b to engage with the housing 9. In short, the conductor 2 must be crimped such that the metal terminal 6 is spaced a predetermined access distance from the position where the shielding terminal 7 is secured, in agreement with the orientation of the shielding terminal 7 positioned so as to face a specific direction. Further, the conductor 2 must be crimped such that the terminal connection hole 6 is oriented toward an appropriate direction in preparation for connection with an input/output terminal of a motor.

If the metal terminal 6 is not press-fitted to the conductor 2 in an appropriate orientation and at an appropriate distance in agreement with the orientation and position of the shielding terminal 7, an access dimension and the orientation of the bolt hole 6b will become inappropriate, thereby imposing extreme difficulty on attaining connection with an input/output terminal of a motor. Thus, the operation for press-fitting the metal terminal 6 is uniquely limited in association with the shielding terminal 7. Hence, assembly operation must be performed with caution and discretion. Such inconvenience induces a remarkable drop in working efficiency.

Another point of the problems is that positioning the shielding terminal 7 by means of causing its projection 7b to engage with the engagement recess 9a of the housing 9 demands a high degree of machining precision; that is, the dimensional tie-in precision and positioning precision of the shielding terminal 7 and those of the housing 9, and a center-to-center dimensional precision of the shielding terminal 7 and that of the housing 9 with respect to the bolt hole used for tightening the mount element B.

SUMMARY OF THE INVENTION

The object of the invention is to provide an electromagnetic wave shielding structure capable of enhancing workability and improving the degree of dimensional-precision freedom of individual members, by means of obviating limitations imposed on the orientations and positions of individual members at the time of an assembly operation.

In order to solve the aforesaid object, the invention is characterized by having the following arrangement.

(1) An electromagnetic wave shielding structure comprising:
a cylindrical conductive shielding member secured to a shield cable, which includes a conductor and a braid surrounding the conductor, and electrically connected to the braid, the shielding member being rotatably attached to a mount hole of a grounded conductive mount element in a state in which the shielding member is secured to the shield cable;
a metal terminal connected to the conductor of the shield cable; and
a housing for housing a part of the shield cable and securing the shielding member to the mount element.

(2) The electromagnetic wave shielding structure according to (1), wherein the metal terminal can be secured to the conductor without involvement of limitations on a rotating angle of the metal terminal, other than setting a dimensional distance between the shielding member secured to the shielded cable and the metal terminal.

(3) The electromagnetic wave shielding structure according to (1), wherein
the shielding member includes a cylindrical portion electrically connected to the braid, and a tapered edge extending outwardly from the cylindrical portion,
the mount hole includes a tapered section which is brought in contact with the tapered edge when the shielding member is attached to the mount hole for preventing the shielding member from passing through the mount hole.

(4) The electromagnetic wave shielding structure according to (3), wherein the housing includes a portion which presses the tapered edge of the shielding member to the tapered section of the mount hole when the housing secures the shielding member to the mount element.

(5) The electromagnetic wave shielding structure according to (4), wherein the housing is fixed to the mount element by a bolt so as to press the tapered edge of the shielding member to the tapered section of the mount hole.

(6) The electromagnetic wave shielding structure according to (1), wherein the housing is fixed to the mount element by a bolt.

(7) The electromagnetic wave shielding structure according to (6), wherein
when the shielding portion and the housing is attached to the mount element in a state in which the housing is not fixed to the mount element by the bolt, the shielding member can be rotated with respect to the mount element, and
when the housing is fixed to the mount element by the bolt, the shielding member is secured to the mount element and is prevented from rotating.

DETAILED DESCRIPTION OF PREFERRED EMBODIMENTS

An embodiment of an electromagnetic wave shielding structure according to the invention will be described in detail by reference to the drawings.

Figure 1:
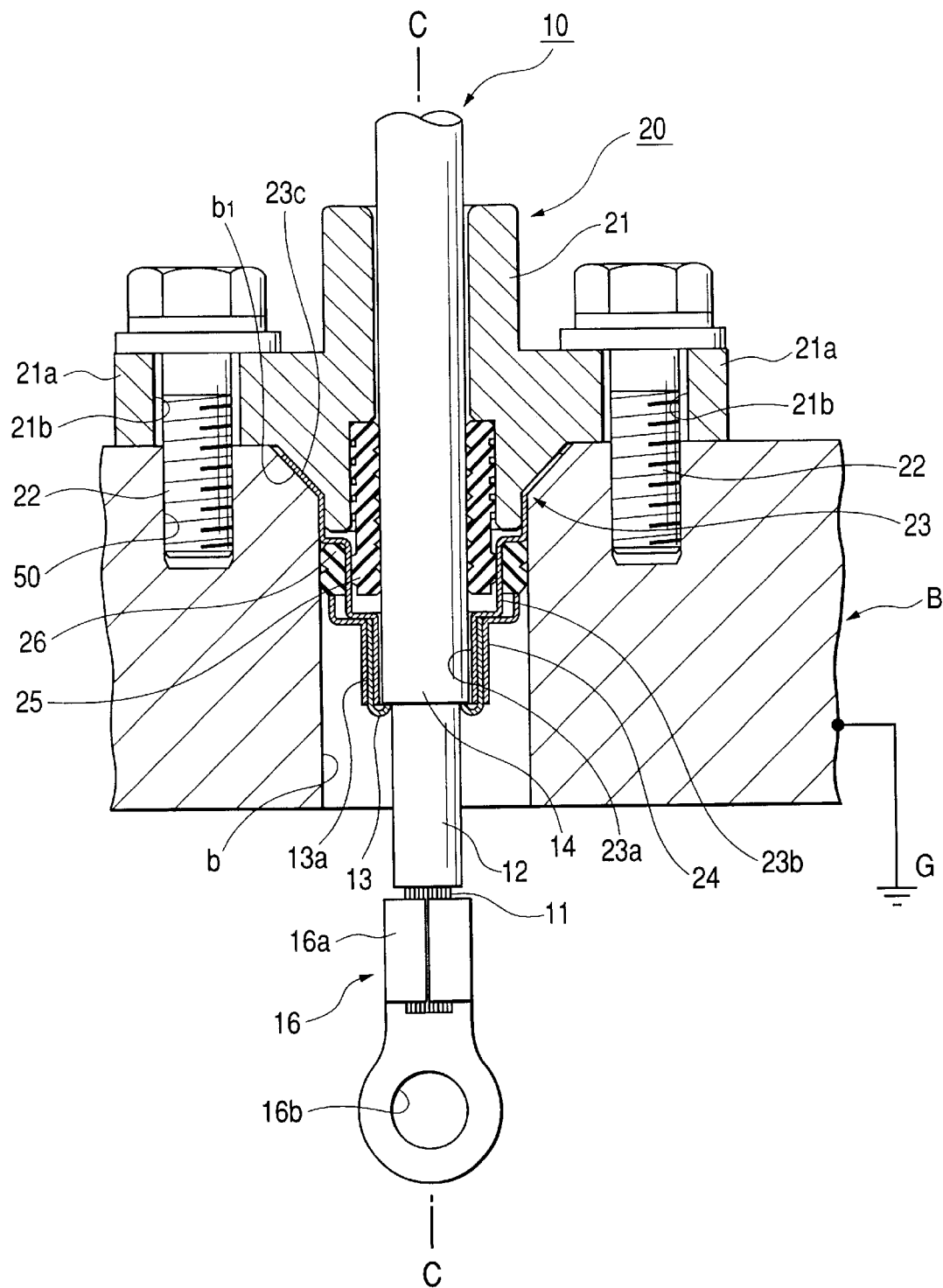
FIG. 1 is a side cross-sectional view showing an embodiment of an electromagnetic wave shielding structure according to the invention.

FIG. 1 is an assembly side cross-sectional view showing an electromagnetic wave shielding structure according to the embodiment. A mount element designated by reference symbol B in the drawing is formed from metal, such as aluminum. No particular limitations are imposed on base material on which the structure is to be mounted. Specifically, the mount element includes a case of a motor installed in an electric-powered vehicle or a housing of electronic/electric equipment. For instance, the shielding structure is for protecting the cable from influence of an electromagnetic wave, by means of inserting an electric wire/cable routed on a vehicle body into a mount hole "b," and connecting metal terminal 16 provided on a cable terminal to an input/output terminal of the motor.

Figure 3:
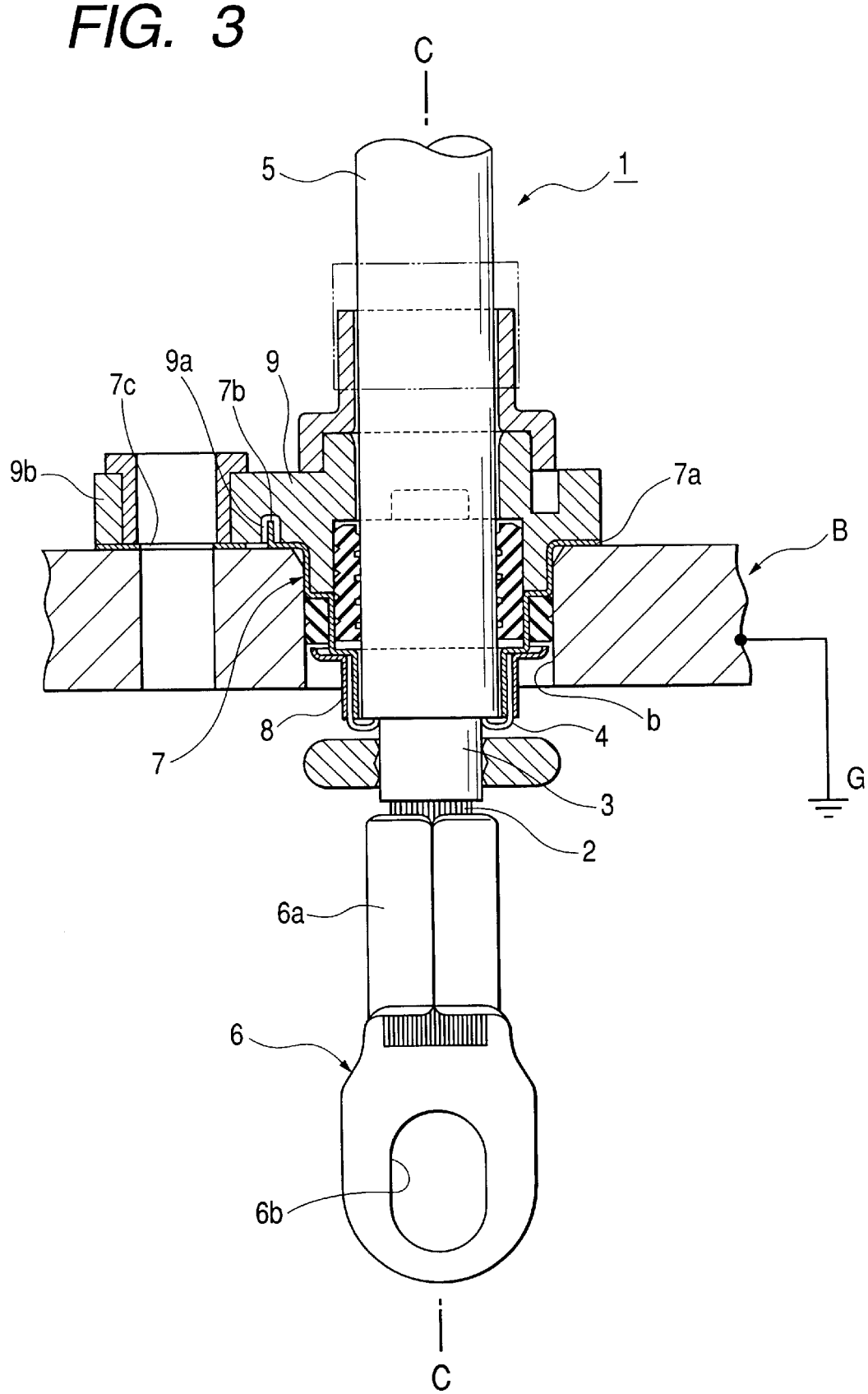
FIG. 3 is a side cross-sectional view showing an example of a related-art electromagnetic wave shielding structure.
Figure 4:
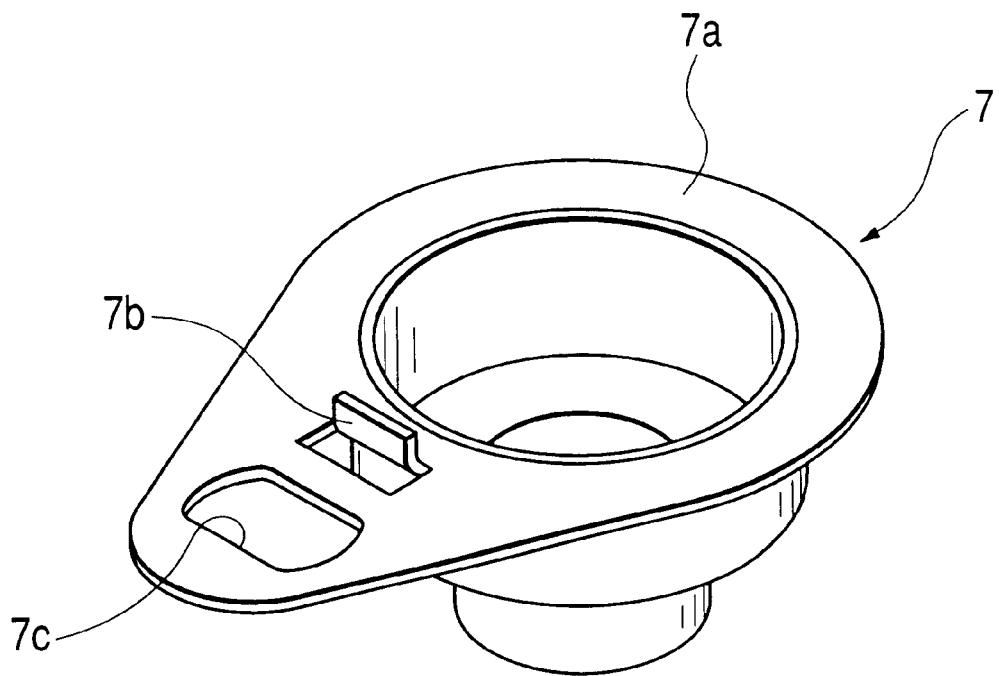
FIG. 4 is a perspective view showing a shielding terminal of the related-art example.

As in the case of the electric wire/cable employed in the related-art shielding structure shown in FIG. 3, the electric wire/cable is a shielded cable 10 formed by means of coating a conductor 11 with an insulator 12 through extrusion; wrapping around the insulator 12 a braid 13 which is a conductive shielding sheet and made of metal; and coating the braid 13 with an outer sheath 14 through extrusion such that the braid 13 is embedded and sandwiched between the insulator 12 and the outer sheath 14. The shielded cable 10 faces a motor case which is a mount element B routed around a vehicle body. The shielded cable 10 is inserted into a mount hole "b" by way of a shielded connector structure 20 consisting of individual members. Electrical conduction is effected by means of connecting metal terminal 16 of the cable terminal with an input/output terminal of the motor.

The shielded connector structure 20 has a housing 21 formed from insulation material to be fitted around an outer periphery of the terminal portion of the shielded cable 10. A sealing characteristic between the housing 21 and the shielded cable 10 is ensured by means of interposing therebetween a cylindrical inner sealing member 25 made of rubber. At least two flanges 21a are formed in the housing 21; in the case of two flanges 21a, the flanges are formed so as to be about 180° out of phase with each other. The housing 21 is affixed to the mount element B by means of stud bolts 22 inserted into bolt holes 21 formed so as to penetrate through the flanges 21a.

Figure 2:
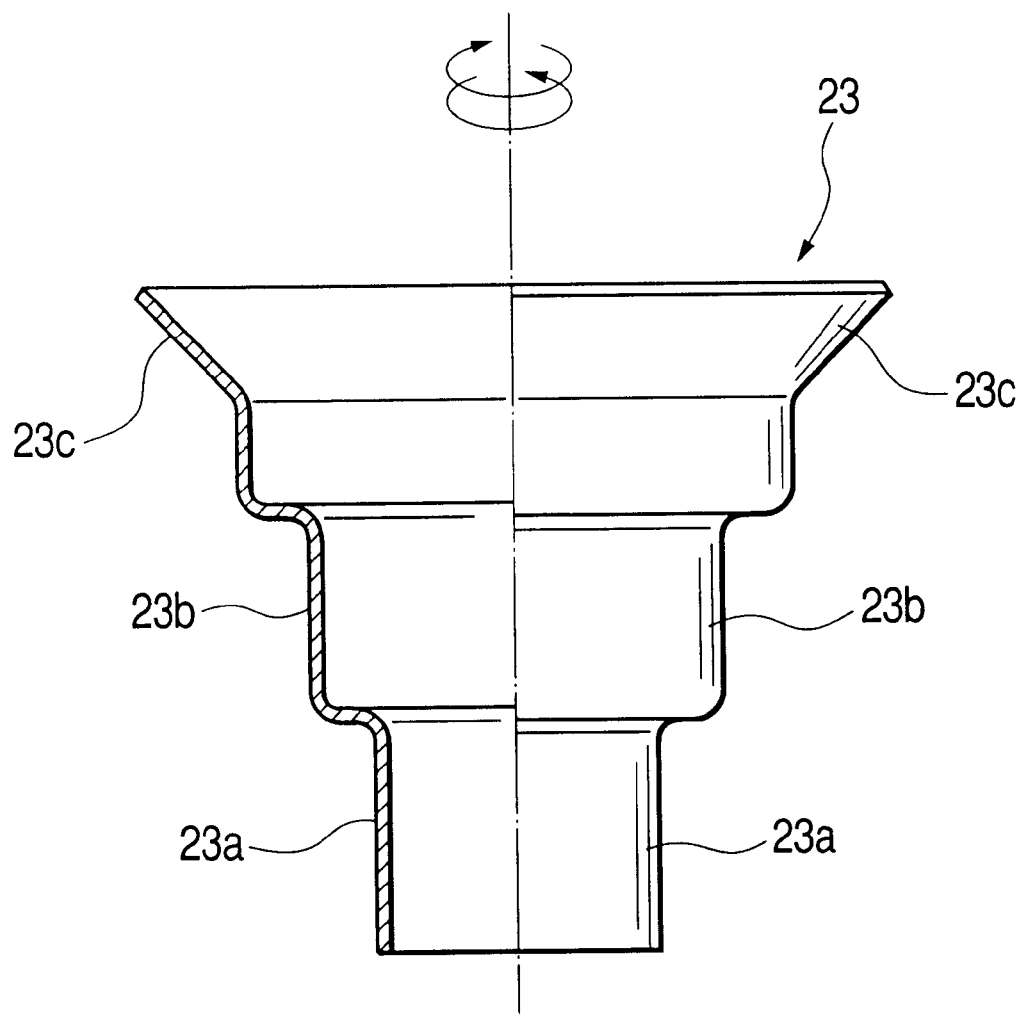
FIG. 2 is a partial cross-sectional view showing a shielding terminal which is a primary component of the embodiment.

As one of the primary components constituting the shielded connector structure 20, the housing 21 has a shield terminal 23 which is formed from conductive metal shown separately in FIG. 2, formed into a cylindrical element having steps of different diameters by means of drawing, and corresponds to a shielding member of the invention. As illustrated, the shielding terminal 23 has a braid contact section 23a, which has a smaller diameter and is located at a lower position. An intermediate body section 23b is larger in outer diameter than the braid contact section 23a. Further, an upper portion of the intermediate body section 23b is formed into an upper tapered edge 23c which is conically tapered so as to become much larger in outer diameter than the intermediate body section 23b.

The shielding terminal 23 is fitted around the outer sheath 14 of the shielded cable 10 and is press-fittingly fixed in a predetermined position by means of crimping. Before press-fitting of the shielding terminal 23, the outer sheath 14 is peeled from the cable terminal, thereby exposing the braid 13 and the insulator 12 located beneath the outer sheath 14. The bottom edge of the braid 13 is folded back. A folded portion 13a is in contact, from the outside, with the braid contact section 23a located in a lower portion of the shielding terminal 23. Further, a braid hold tube 24 is fitted so as to compress the folded portion 13a of the braid 13 from the outside. In conjunction with the braid contact section 23a of the shielding terminal 23, the braid hold tube 24 fixedly holds the folded section 13a. The inner sealing member 25 is fittingly set in intimate contact with an inner peripheral surface of the intermediate body section 23b of the shielding terminal 23. An outer sealing member 26 formed from rubber into the shape of a ring is fittingly set in intimate contact with an outer peripheral surface of the intermediate body section 23b. The outer sealing member 26 fits and comes into intimate contact with the mount hole "b" of the mount member B, thereby ensuring the sealing characteristics required for the mount hole "b."

The upper tapered edge 23c of the shielding terminal 23 is in contact and flush with a tapered and chamfered section $b_1$ which is formed by means of tapering the upper edge of the mount hole "b" at the same inclination. In this way, the entirety of the shielding terminal 23 is set fittingly in the mount hole "b," and the housing 21 and the shielding terminal 23a recombined together such that the housing 21 is placed on top of the shielding terminal 23.

Consequently, before the housing 21 is joined to the mount element B by means of the stud bolts 22, the shielding terminal 23 fixedly press-fitted on the outer periphery of the shielded cable 10 can be rotated a small angle about the axis C—C along with the shielded cable 10.

In relation to the electromagnetic wave shielding according to the embodiment having the foregoing construction, there will now be described an assembled state of the structure and operation of the shield after assembly.

In the terminal of the shielded cable 10, the outermost sheath 14 is peeled, thereby exposing the braid 13 and the insulator 12 provided below the sheath 14. The thus-exposed insulator 12 is peeled, thereby exposing the conductor 11 in preparation for setting of the shielding terminal 23 which is to be performed in the next process.

The shielding terminal 23 is fitted around the outer periphery of the shielded cable 10 and press-fittingly fixed on an outer periphery of the sheath 14, by means of crimping the braid contact section 23a. The position where the shielding terminal 23 is to be fixed is set so as to be spaced a given distance from an end face of an exposed extremity of the conductor 11 subsequently, the metal terminal 16 is press-fitted to the conductor 11 by means of crimping a press-fitting section 16a. So long as the distance between the shielding terminal 23 and the metal terminal 16 is as having been set, or an access dimension from the mount hole "b" to the metal terminal 16 has been determined beforehand, no problem will arise even if a terminal connection hole 16b of the metal terminal 16 is oriented with a slight deviation.

Again in relation to the shielding terminal 23, the exposed braid 13 of the shielded cable 10 is folded back, and the folded portion 13a is brought into contact, from the outside, with the braid contact section 23a of the shielding terminal 23. The braid hold tube 24 is fittingly placed, from the outside, on the folded portion 13a of the braid 13. The braid hold tube 24 catches and fixedly holds the folded portion 13a of the braid 13 in cooperation with the braid contact section 23a of the shielding terminal 23. At this time, the outer shielding member 26 is set and fitted around a position between the intermediate body section 23b of the shielding terminal 23, and the braid hold tube 24.

Subsequently, the inner sealing member 25 is fitted in the inner periphery of the shielded cable 10 and fittingly set on the inner periphery of the intermediate body section 23b of the shield terminal 23. The housing 21 is fitted into the outer periphery of the shielded cable 10 so as to cover the members from above. The entirety of the pre-assembled shielded connector structure 20 is placed in the mount hole "b" of the mount element B in preparation for fastening of the shielded connector structure 20, which is to be performed by means of the stud bolts 22 in the final process.

When the entirety of the pre-assembled shielded connector structure 20 has been placed in the mount hole "b" of the mount element B, the terminal connection hole 16b of the metal terminal 16 projecting from the mount hole "b" may be oriented inappropriately with respect to the motor input/output terminal to which the shielded connector structure 20 is about to be connected. The shield terminal 23 can be rotated about the axis C—C until it is oriented in the appropriate direction. In this rotating operation, since the housing is not secured on the mount element B through the bolts 22 yet, the shield terminal 23 is not pressed to the mount element B by the housing and can be rotated relative to the housing 21 so that the bolt holes 21b can be positioned above bolt insertion holes 50 of the mount element B, respectively. At this time, the upper tapered edge 23c of the shield terminal 23 is in slidable contact with the tapered and chamfered section $b_1$ formed in the upper edge of the mount hole "b," and the shielded connector structure 20 can be rotated until the terminal connection hole 16b of the metal terminal 16 is oriented appropriately.

Subsequently, the housing 21 is secured on the mount element B by means of tightening the studs bolts 22 in the flanges 21a, whereby the shielded cable 10 is set in the mount hole "b" of the mount element B by way of the shielded connector structure 20. The metal terminal 16 is connected to the motor input/output terminal by way of the terminal connection hole 16b and through use of an unillustrated bolt, thereby electrically connecting the shielded cable 10 to the input/output terminal. Since the mount element B is grounded by means of the ground G, the shielded cable 10 realizes shielded conduction along a route from the folded portion 13a of the braid 13 to the ground G by way of the shield terminal 23 and the mount element B.

As can be understood from the above descriptions, in the pre-assembly phase of the shielded connector structure 20, the metal terminal 16 can be crimped to the conductor 11 at a desired rotating angle or orientation around the axis C—C of the cable 10, so long as the access dimension is ensured as has been set with respect to the shielding terminal 23 press-fitted to the outer periphery of the sheath of the shielded cable 10. Accordingly, limitations on operations are lessened correspondingly, thereby enhancing assembly efficiency.

Even in connection with machining precision of the individual members, there can be eliminated at least the limitations on the related-art shielding structure, such as positioning of the shield terminal 23 uniquely to the position of a predetermined rotating angle. Moreover, there can also be obviated a necessity for dimensional correspondence between the shield terminal 23 and the bolt holes 21b formed in the flanges 21a of the housing 21. There is yielded an advantage of the ability to correspondingly facilitate machining of a member in terms of precision of a tie-in between members or positioning precision.

As has been described, an electromagnetic wave shielding structure described in claim 1 of the invention is arranged so that a shielding member (i.e., a shield terminal), which is a perfect-circle cylindrical element, can be rotated to an arbitrary pivotal position while being fitted to a mount hole in a pre-assembly phase. Hence, in contrast with a related-art shielding structure which is fixed in one position around the axis of a cable, a separate positioning mechanism is not necessary, and fit-in dimensional precision between members is obviated, thereby enhancing the degree of freedom. Hence, the electromagnetic wave shielding structure is advantageous in terms of costs of parts.

According to an electromagnetic wave shielding structure described in claim 2, so long as the shielding member is attached to the shielded cable such that a predetermined distance is ensured between the shielding member and metal terminal, the metal terminal is desirably crimped to a conductor without regard to the shielding member and without being limited by the orientation of the metal terminal, thus enabling an efficient press-fitting operation. If the orientation of the hardware is inappropriate for connecting the cable to an input/output terminal of a motor, the orientation of the hardware is corrected by rotating the shielding member press-fitted on the shielded cable to an appropriate position of a rotating angle while being fitted in the mount hole of the mount element in a pre-assembly phase. As a result, the metal terminal can be brought into a position and orientation suitable for connecting the metal terminal to the input/output terminal of the motor with bolts.

According to an electromagnetic wave shielding structure of claim 3, a tapered edge is formed in one end of the cylindrical element of the shielding member. The tapered edge is slidably engaged with a corresponding tapered and chamfered section of amount hole. As a result, the shielding member acts as a stopper to only the extent corresponding to the cone angle of the tapered section, thereby effectively preventing dislodgment of the shielded cable in one direction. By means of such a tapered engagement section, a rotating angle of the shielded cable around the axis thereof can be corrected freely in only a pre-assembly phase of the cable in conjunction with the shielding member.

According to an electromagnetic wave shielding structure of claim 4, the housing is brought into contact with the shielding member in only one direction. No limitations are imposed on the direction in which the housing and the shielding member are to be assembled. In contrast with the related-art shielding structure, there is no necessity for setting a center-to-center dimensional precision for fitting in the members with bolts. Hence, limitations on the assembly operation can be lessened correspondingly, and costs of components are effectively curtailed.

What is claimed is:

1. An electromagnetic wave shielding structure comprising:
   a cylindrical conductive shielding member secured to a shield cable, which includes a conductor and a braid surrounding the conductor, and electrically connected to the braid, the shielding member being rotatably attached to a mount hole of a grounded conductive mount element in a state in which the shielding member is secured to the shield cable;
   a metal terminal connected to the conductor of the shield cable; and
   a housing for housing a part of the shield cable and securing the shielding member to the mount element.

2. The electromagnetic wave shielding structure according to claim 1, wherein the metal terminal can be secured to the conductor without involvement of limitations on a rotating angle of the metal terminal, other than setting a dimensional distance between the shielding member secured to the shielded cable and the metal terminal.

3. The electromagnetic wave shielding structure according to claim 1, wherein
   the shielding member includes a cylindrical portion electrically connected to the braid, and a tapered edge extending outwardly from the cylindrical portion,
   the mount hole includes a tapered section which is brought in contact with the tapered edge when the shielding member is attached to the mount hole for preventing the shielding member from passing through the mount hole.

4. The electromagnetic wave shielding structure according to claim 3, wherein the housing includes a portion which presses the tapered edge of the shielding member to the tapered section of the mount hole when the housing secures the shielding member to the mount element.

5. The electromagnetic wave shielding structure according to claim 4, wherein the housing is fixed to the mount element by a bolt so as to press the tapered edge of the shielding member to the tapered section of the mount hole.

6. The electromagnetic wave shielding structure according to claim 1, wherein the housing is fixed to the mount element by a bolt.

7. The electromagnetic wave shielding structure according to claim 6, wherein
   when the shielding portion and the housing is attached to the mount element in a state in which the housing is not fixed to the mount element by the bolt, the shielding member can be rotated with respect to the mount element, and
   when the housing is fixed to the mount element by the bolt, the shielding member is secured to the mount element and is prevented from rotating.

8. The electromagnetic wave shielding structure according to claim 1, wherein said housing is affixed to said mount element by at least two stud bolts.

9. The electromagnetic wave shielding structure according to claim 8, wherein said housing comprises at least two opposing flanges protruding in radial directions with respect to said shield cable, and said at least two stud bolts pass through bolt holes in said flanges to affix said housing to said mount element.

10. The electromagnetic wave shielding structure according to claim 8, wherein said shielding member can still be rotated when said at least two stud bolts are partially installed, but not fully tightened.

11. The electromagnetic wave shielding structure according to claim 9, wherein said shielding member can still be rotated when said at least two stud bolts are partially installed, but not fully tightened.

12. The electromagnetic wave shielding structure according to claim 6, wherein said shielding member can still be rotated when said bolt is partially installed, but not fully tightened.

13. The electromagnetic wave shielding structure according to claim 1, wherein said shielding member is rotatable in relation to both said housing and said mount element.

14. The electromagnetic wave shielding structure according to claim 1, wherein said housing and said mount element directly contact and sandwich said shielding member.

15. The electromagnetic wave shielding structure according to claim 1, wherein said shield cable, said shielding member and said housing are arranged within a mount hole of said mount element so that said shield cable passes through said housing and said shielding member is disposed entirely within said mount hole.

16. The electromagnetic wave shielding structure according to claim 1, wherein said housing and said mount element are at least partially directly connected.

17. The electromagnetic wave shielding structure according to claim 9, wherein said flanges of said housing and said mount element are directly connected.

* * * * *